(12) United States Patent  
Lin

(10) Patent No.: US 7,372,162 B2  
(45) Date of Patent: May 13, 2008

(54) MULTIPLE SELECTABLE FUNCTION INTEGRATED CIRCUIT MODULE

(75) Inventor: Mou-Shiung Lin, Hsinchu (TW)

(73) Assignee: Megica Corporation, Hsin-Chu (TW)

( * ) Notice: Subject to any disclaimer, the term of this patent is extended or adjusted under 35 U.S.C. 154(b) by 52 days.

(21) Appl. No.: 11/181,175

(22) Filed: Jul. 14, 2005

(65) Prior Publication Data

US 2005/0251586 A1     Nov. 10, 2005

Related U.S. Application Data

(60) Division of application No. 09/961,767, filed on Sep. 21, 2001, now Pat. No. 6,939,747, which is a continuation-in-part of application No. 09/246,303, filed on Feb. 8, 1999, now Pat. No. 6,356,958.

(51) Int. Cl.
    *H01L 23/48*     (2006.01)
(52) U.S. Cl. ..................... 257/773; 257/772
(58) Field of Classification Search ............. 257/678, 257/690, 773, 777, 778, 782, 772
    See application file for complete search history.

(56) References Cited

U.S. PATENT DOCUMENTS

| | | | |
|---|---|---|---|
| 5,258,648 A | 11/1993 | Lin | 257/778 |
| 5,360,992 A | 11/1994 | Lowrey et al. | 257/666 |
| 5,421,079 A | 6/1995 | Cipolla et al. | 29/760 |
| 5,737,767 A | 4/1998 | Agrawal et al. | 711/171 |
| 5,767,565 A | 6/1998 | Reddy | 257/620 |
| 5,898,186 A | 4/1999 | Farnworth et al. | 257/48 |
| 6,114,770 A * | 9/2000 | Akram et al. | 257/784 |
| 6,175,951 B1 | 1/2001 | Shyu | 716/17 |
| 6,180,426 B1 | 1/2001 | Lin | 438/15 |
| 6,356,958 B1 | 3/2002 | Lin | 710/1 |
| 6,385,756 B1 | 5/2002 | Braun | 716/1 |
| 6,392,304 B1 * | 5/2002 | Butler | 257/777 |
| 6,669,738 B2 * | 12/2003 | Akram et al. | 438/118 |
| 6,730,994 B2 * | 5/2004 | Kinsman | 257/676 |

* cited by examiner

*Primary Examiner*—Kevin M Picardat
(74) *Attorney, Agent, or Firm*—Saile Ackerman LLC; Stephen B. Ackerman; Billy Knowles

(57) ABSTRACT

An integrated circuit module has a common function known good integrated circuit die with selectable functions. The selectable functions are selected during packaging of the known good integrated circuit die. The known good integrated circuit die is mounted to a second level substrate. The second level substrate has wiring connections to the input/output pads of the known good integrated circuit die that select desired input functions and output functions. Further, the wiring connections on the second level substrate provide signal paths to transfer signals to the desired input function and signals from the desired output function, and signals to and from the common functions. Also, the wiring connections form connections between the input/output pads and external circuitry. To select the desired input functions and the desired output functions, appropriate logic states are applied to input/output pads connected to a function selector to configure a functional operation of the integrated circuit module. The second level module substrate has connector pins to provide physical and electrical connections between the external circuitry and the wiring connections on the second level substrate.

15 Claims, 13 Drawing Sheets

FIG. 1 – Prior Art

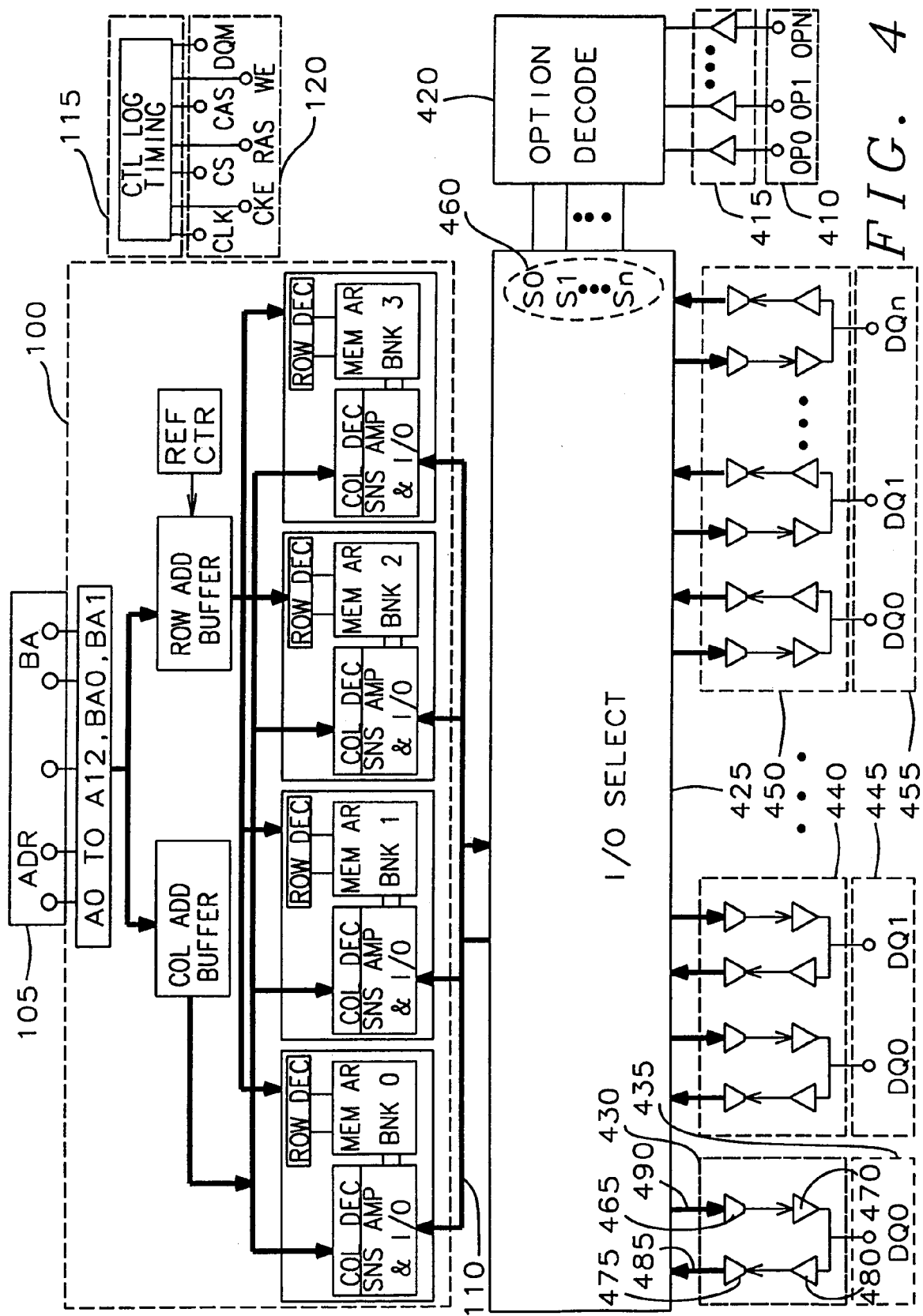

LEGEND
⊘ Connection
○ No Connection

LEGEND
⊘ Connection
○ No Connection

MULTIPLE SELECTABLE FUNCTION INTEGRATED CIRCUIT MODULE

This application is a division of patent application Ser. No. 09/961,767 filing date Sep. 21, 2001 now U.S. Pat. No. 6,939,747, A Multiple Selectable Function Integrated Circuit Module, which is a Continuation-in-Part of U.S. patent application Ser. No. 09/246,303, filing date Feb. 8, 1999 now U.S. Pat. No. 6,356,958, assigned to the same assignee as the present invention, which are herein incorporated by reference in their entirety.

RELATED PATENT APPLICATIONS

This application is related to the U.S. patent application Ser. No. 09/258,911, filing date Mar. 1, 1999, now U.S. Pat. No. 6,180,426 B1, issued Jan. 30, 2001.

This application is a Continuation-in-Part of U.S. patent application Ser. No. 09/246,303, filing date Feb. 8, 1999.

BACKGROUND OF THE INVENTION FIELD OF THE INVENTION

1. Field of the Invention

This invention is related to integrated circuits. More particularly, this invention relates to multiple function integrated circuits such as Dynamic Random Access Memories (DRAM) having function selection through wiring connections on a second level substrate onto which an integrated circuit is mounted.

2. Background of the Related Art

The structure of a DRAM is well known in the art. Usually a DRAM chip is configured to be organized as a ×1 (by 1), ×4 (by 4), ×8 (by 8), or ×16 (by 16) package by selective destruction of fuses internal to the DRAM chip and by selectively connecting the data input/output pads to pins on a package. The unused pins are not connected to the input/output pads of the undesired or unused data transfer pads. Refer now to FIG. 1 for a schematic drawing of the structure of a DRAM integrated circuit showing the input/output selection function. A DRAM array 100 has multiple banks of arrays of DRAM cells. Address signals are applied to the address I/O's 105 and decoded within column address and row address decoders to select DRAM cells within the DRAM array 100.

Control and timing signals 120 are applied to the control logic and timing generator 115 to provide the necessary control and timing functions for the DRAM array 100.

Upon applying an address to the DRAM array 100, digital data is transferred to or from the DRAM array 100 by the internal data bus 110. The internal data bus 110 is connected between the sense amplifier and I/O bus on each memory bank. The internal data bus 110 may conceptually have a connection for each column of one memory bank, but usually is the maximum data bit width configuration of the DRAM integrated circuit.

The internal data bus 110 is connected to the input/output selector 125. The input/output selector 115 determines the interconnections between the input/output buffers 130 and the internal data bus 110. The selection pins 140 of the input/output selector 125 are connected to the selection networks formed of the resistors 145a, 145b, and 145c and the fuses 150a, 150b, and 150c. A logical one state is applied to the selection pins 140, if a fuse 150a, 150b, and 150c is opened. A logical zero state is applied to the selection pins 140, if a fuse 150a, 150b, and 150c remains intact. The logical states applied to the selection pins 140 determine which connections on the internal data bus 110 are connected to which of the input/output buffers 130. While, as shown, the selector circuits will draw unacceptable amounts of standby current, it is presented here for illustration. Other techniques known in the art are used to form the selection networks.

The input/output buffers 130 are connected to the pads 135. The fuses 150a, 150b, and 150c of the selection network are opened either as a masking during a final metalization or personalization by blowing the fuses 150a, 150b, and 150c with highly intense laser light prior to separation of a wafer containing the DRAM integrated assembly into DRAM modules.

Those input/output pads 135 not used for a configuration are not connected to the module connections during the next level assembly. The fused configuration selection forces the maintenance of inventory of the DRAM die for each desired configuration increasing the difficulty in planning of production of DRAM wafers.

While the structure of the prior art as shown in FIG. 1 is described for a DRAM, other integrated circuit functions such as computational processors (microprocessors, microcontrollers, digital signal processors, etc.), programmable memory, and programmable logic arrays employ metal masking or fuse destruction at the wafer level, and making or omitting connections during attachment of the functional integrated circuit die to a next level package assembly. This complicates the semiconductor processing in that extra masking steps are required for mask programming of desired functions of the functional integrated circuit die. Each function desired requires a unique mask for the selection process, further complicating the semiconductor process. Additionally, fuse destruction adds an extra step in the processing of the functional integrated circuit die.

FIG. 2 shows a process for forming integrated circuit modules. The process begins with the formation 200 of the integrated circuit chip on a semiconductor wafer. The semiconductor process 210 forms the collection of transistors that are the electronic circuits on the semiconductor wafer. The electronic circuits are interconnected by metalization and are also connected to input/output pads by the metalization placed on the surface of the semiconductor wafer. During the metalization, optional functions may be personalized to select optional functions. In the case of the DRAM of FIG. 1, the fuses 150a, 150b, and 150c are either opened or held intact during this process to select the desired input/output organization options. An alternative to selecting the desired input/output organization options of the DRAM of FIG. 1 is exposing the metalization on the surface of the semiconductor substrate that forms the fuses 150a, 150b, and 150c to intense laser light to destroy the appropriate fuses 150a, 150b, and 150c.

The steps of formation of the integrated circuit chip is common for all the desired selectable functions until the metalization to select the desired functions. The integrated circuit chips then becomes a custom design. Equally, the integrated circuit chip has a common design until the destruction of fuses to create the custom personalization that selects each desired function of the integrated circuit chip.

The semiconductor wafer is placed on a test system and each integrated circuit chip is tested 215 for functionality. The functioning chips are denoted as functional die. The semiconductor wafer is then diced 220 and the functional die are separated for further assembly 225 in a first level or module package. The selection or omission of connections between the functional integrated circuit die and the first level package is a custom design particular to each combination of desired functions.

The input/output pads of the desired functions of the functional die are connected by a method such as wire bonding or tape automated bonding to the pins of the first level package. The input/output pads of the undesired function are omitted during the wire bonding or tape automated bonding. The package is tested 230 and inventoried 235 for further assembly.

The assembly 205 of the second level package begins by forming 240 the substrate of the second level assembly. Multiple layers substrate are formed having interconnection metalization that connects the packaged and tested die to external circuitry that is present either on the second level package or elsewhere within the electronic system. The multiple layers are assembled to form the substrate of the second level assembly.

A solder mask is placed 245 on the second level assembly and a solder paste is placed 250 at all connection points of the packaged and tested die. The packaged and tested die is attached 255 to the second level assembly. In a surface mounted packaging system, the solder paste is melted and the pins of the packaged and tested die fused to the metalization of the second level assembly. The remaining processing of the second level assembly is completed 260.

For integrated circuit modules having multiple functions, the metalization of the second level assembly must be customized. Again, this increases the number of assembly types required to be inventoried.

U.S. Pat. No. 5,360,992 (Lowery et al.) discloses a semiconductor package, which allows pinouts and bond options to be customized after encasement of a semiconductor die. The semiconductor package has two assemblies in a first embodiment and an optional third assembly in a second embodiment.

A first assembly comprises a semiconductor die encased in plastic, ceramic, or other suitable material. All available bond options (bond pads) are routed to the exterior portion of the package by a first assembly frame. Portions of the first assembly frame are exterior to the encasement and terminate in exterior pad portions that can be conductively bonded to.

A second assembly of the invention comprises a second assembly frame that provides a means of input/output (I/O) between the packaged die and a next level of assembly onto which it is installed. The second assembly frame comprises conductive paths to which the exterior pad portions are connected, the first assembly being conductively mounted to the second assembly thereby. With the two-piece embodiment of the invention, the frame of the second assembly determines the pinouts (the pin numbers associated with each of the signals of the device) of the various signals of the die contained within the first assembly.

The optional third assembly, which, if used, is interposed between the first and second assemblies, comprises means for "keying" the exterior pad portion desired locations or the second assembly frame. The assembly can comprise at least two different forms.

In the first form, the third assembly is a nonconductive membrane having voids there through, conductive paths of the second assembly are located in an "X" direction, while the exterior pad portions of first assembly of this form are bars extending in a "Y" direction. By selectively placing the voids in the membrane, the pads of the first assembly can either be connected with the conductive paths of the second assembly or isolated from the conductive paths if no void is formed. Using the X-Y arrangement, any of the bond options can be connected with any of the pinouts. Connecting is accomplished by coating the bars with a conductive material and interposing the insulative membrane between the first and second assemblies. The conductive material fills the voids, thereby passing signals between the first and second assemblies.

In the second form, the third assembly comprises a flex circuit as used with tape automated bonding. The second assembly has a single design, and the layout of the flex circuit determines the pinouts and options of the semiconductor device. The flex circuit is conductively mounted to the first and second assemblies in a fashion consistent with tape automated bonding (TAB) technology, for instance with solder, or by some other means such as conductive epoxy.

U.S. Pat. No. 5,737,767 (Agrawal et al.) teaches a random access memory (RAM) array with a reconfigurable bit width or word width. In one embodiment, a reconfigurable x-y RAM array is provided which includes a memory array comprised of a plurality of RAM cell columns. The RAM cell columns are organized into a number of groups where the number of groups corresponds to the bit width of the memory. Each group contains an equal number of columns so that the number of columns in a group multi number of groups equals the total number of array. The number of columns in a group is reconfigurable according to the present invention. Thus, when the number of columns in a group is smaller, the number of groups is larger and when the number of columns in a larger, the number of groups is smaller. Thus, the bit width of the memory is reconfigurable by modifying the number of columns in a group, since the bit memory corresponds to the number of groups.

To access a word stored in the array, The RAM decodes an address and selects one bit from each column group. Thus, the word size stored by the RAM is determined by the number of columns groups configured in the array.

Agrawal et al. provides multiplexer (mux) logic coupled to each column. Column select logic decodes a memory address and provides select signals corresponding to the address to the mux logic. The mux selects a particular column in the group to be accessed and outputs a column bit signal indicative of the memory state of the selected column.

Column configuration logic is coupled to the mux logic and combines the mux outputs into memory bit signals. The mux outputs combined by the column configuration logic determine the size of the column groups from which a memory bit signal is selected. The column configuration logic may be placed in different modes to configure different column group sizes and thus to reconfigure the bit width of the memory. The column select logic is responsive to the configuration mode and decodes the address for the appropriate column group size.

SUMMARY OF THE INVENTION

An object of this invention is to provide integrated circuit modules having common known good integrated circuit die. Selectable functions of the known good integrated circuit die are chosen during packaging of the known good integrated circuit die. Such selectable functions allow a reduction of the variety of integrated circuit components during manufacturing and assembly. This provides a method to reduce the required inventory of integrated circuit components at integrated circuit manufacturers, distributors, and integrated circuit users.

Another object of this invention is a method of assembly of integrated circuit modules to choose selectable functions of known good integrated circuit die to be mounted in the integrated circuit modules.

The integrated circuit module has a substrate of a first type an integrated circuit to be mounted to the module. The integrated circuit has multiple selectable input functions, multiple selectable output functions, common functions, a function selector, all are interconnected and connected to input/output pads. The substrate of the first type is mounted to a substrate of a second type. The substrate second type has wiring connections to the input/output pads of the substrate of the first type and thus to the integrated circuit that select desired input functions and output functions. Further, the wiring connections on the substrate of the second type provide signal paths to transfer signals to the desired input function and signals from the desired output function, and signals to and from the common functions. Also, the wiring connections form connections between the input/output pads and external circuitry. To select the desired input functions and the desired output functions, appropriate logic states are applied to input/output pads connected to the function selector to configure a functional operation of the integrated circuit. The substrate of the second type has connector pins to provide physical and electrical connections between the external circuitry and the wiring connections on the substrate of the second type.

The integrated circuit may be a DRAM integrated circuit die. The DRAM integrated circuit has a plurality of selectable input/output organizations. Each of the selectable input/output organizations is selected as one of the logic states to the function selector and connections from the second level substrate to unused input/output function connected to input/output pads of the DRAM are omitted from the second level substrate.

The integrated circuit may be a common computational processor (a microprocessor, a microcontroller, a digital signal process, etc.). The common computational processor has selectable input functions and selectable output functions that include analog-to-digital converters, digital-to-analog converters, general purpose word-width input/output buses, standard compliant serial interfaces, interfaces to host processors of a system, control signal inputs and outputs, timer/counter inputs and outputs, computer operating properly signals, and interrupt signals.

In one implementation of the integrated circuit module, the input/output pads of the substrate of the first type are solder bumps, which are arranged as a ball grid array. The selectable input functions and the selectable output functions are chosen by creating or omitting voids in a solder mask on the second level substrate during assembly. The desired connections are then made to the second level substrate and the undesired connections are omitted.

The method to form an integrated circuit module begins by forming an integrated circuit die having multiple selectable input functions, multiple selectable output functions, common functions, and a selector function. The integrated circuit die is created by forming electronic components on a surface of a semiconductor wafer to form the multiple selectable input functions, the multiple selectable output functions, common functions, and the selector function. Redistribution metallurgy is then formed on the surface of the semiconductor wafer to form input/output pads connected to the multiple selectable input functions, the multiple selectable output functions, the common functions, and the selector functions. The integrated circuit die is then tested to determine functional integrated circuits die. The semiconductor wafer is then diced to separate integrated circuit die are then burned-in, tested to find the known good integrated circuit die. The known good integrated circuit die are then sorted and inventoried.

The substrate of the second type is created by forming metal interconnections on multiple layers of the substrate of the second type, and laminating of the multiple layers of the substrate of the second type. The integrated circuit module is then assembled by applying a solder mask to a component level of said substrate of the second type. The solder mask is applied to the substrate of the second type so as to have voids to expose the input/output pads of the common functions, desired functions of the multiple selectable input functions and the multiple selectable output functions, and the input/output pads that select the desired functions with input and output functions. The solder mask will have the voids omitted to eliminate the connections of the non-desired functions of the multiple selectable input functions, the multiple selectable output functions, and the selector function by coating the input/output pads of the non-desired functions. A solder paste is deposited on the input/output pads exposed by the solder mask. The substrate of the first type is then placed and secured to the component level of the second level substrate. The method is then completed with final assembly and test of the integrated circuit module.

In a first embodiment of the present invention, the substrate of the first type is a semiconductor substrate or die onto which the integrated circuit is formed. The integrated circuit die is mounted directly to the substrate of the second type. The input/output pads of the integrated circuit die are either connected or not connected to the corresponding pads of the substrate of the second type to activate the desired functions of the integrated circuit.

In a second embodiment of the present invention, the substrate of the first type is a substrate that is to provide a connective transformation of the input/output pads of the integrated circuit die and the metal interconnections of the substrate of the second type. For the second embodiment, the substrate of the first type is created by forming metal connections that align with input/output pads of the integrated circuit die and extend to align with the connections points on the substrate of the second type. The integrated circuit die is mounted and secured to the substrate of the first type.

The substrate of the first type with the integrated circuit die mounted is then tested, optionally burned-in, sorted, and inventoried.

The substrate of the first type with the mounted integrated circuit die is then secured to the substrate of the second type. The substrate of the second type has the desired metal connections made between the substrate of the first type and the substrate of the second type to select the preferred functions of the integrated circuit.

BRIEF DESCRIPTION OF THE DRAWINGS

FIG. 4 is a schematic diagram of a DRAM illustrating the configuring circuitry of this invention.

DETAILED DESCRIPTION OF THE INVENTION

Figure 3:
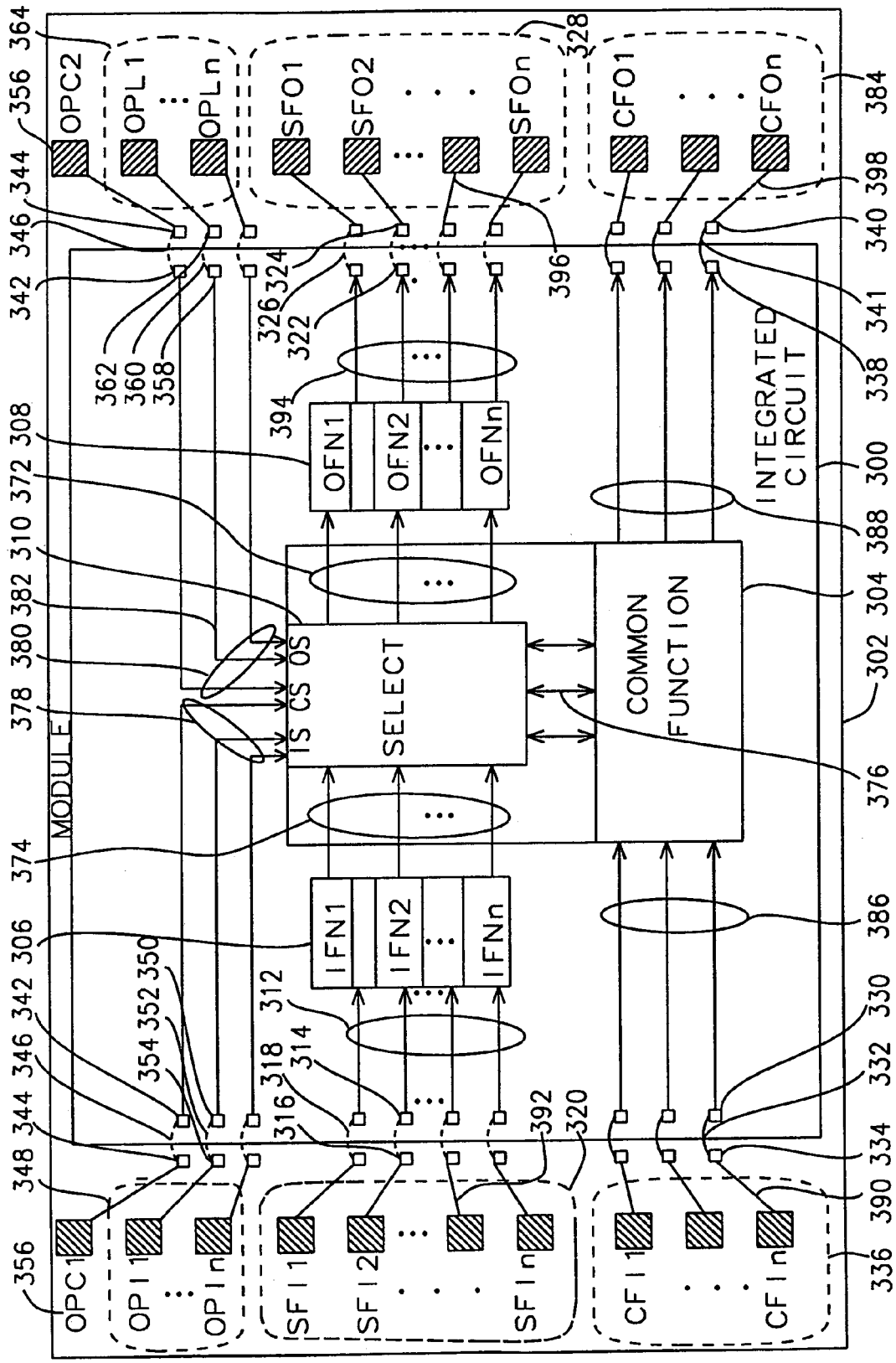
FIG. 3 is a diagram of an integrated circuit package illustrating the configurability of a known good integrated circuit die having multiple selectable functions of the first embodiment of this invention.

For a description of a general description of a general embodiment of this invention, refer now to FIG. 3. A multiple selectable function integrated circuit die 300 has a plurality of selectable input functions 306 and selectable output functions 308 and common functions 304. The selectable input functions 306 are circuits that implement such functions as interface standard receivers, analog-to-digital converters, and address and control decoders. The selectable output functions 308 are circuits that implement such functions as interface standard drivers, digital-to-analog converters, address drivers, data drivers, control drivers, and timing signal drivers. The common functions 304 are circuits that implement such functions as DRAM array address and support functions, SRAM array address and support functions, non-volatile memory array address and support functions, computational processor circuitry such as arithmetic logic units and multiply accumulate function, program decoder circuits, timing circuits, and address generation. A select function 310 is connected to the selectable input functions 306, the selectable output functions 308, and the common functions 304 by the internal input bus 374, the internal output bus 372, and the internal common bus 376. The computational processor may be configured as a microprocessor, a microcontroller, a digital signal processor, or other complex logic function.

The select function 310, is based on the logic states of the select signals 378, the common select signals 380, output select signals 382, the interconnections between the internal input bus 374, the internal output bus 372, and the internal common bus 376. Any of the selectable input functions 306, selectable output functions 308, and common functions 304 that are not to be configured are effectively disabled and disconnected from those that are being configured for a given configuration of the integrated circuit module.

Not shown in the connections to power supply voltage sources and to the ground reference points. These connections are required for the functioning of the known good integrated circuit die 300 and in fact may be connected or disconnected from the selectable input functions 306 or the selectable output functions 308 as part of the selection of these functions.

The common input and the common output signals 386 and 388 that are common to all configurations of the integrated circuit module are introduced to the common input module connectors 336 and are received from the common output module connectors 336. The common input module connectors 336 have internal module wiring 390 connected to the common input module pads 334. The common input module pads 334 are connected 332 in a predetermined fashion to the common input pads 330 on the integrated circuit die 300. Conventionally, input module pads 334 are connected to the input pads 330 as wirebonds, tape automated bonds, and solder bumps of ball grid array. The common output module connectors 384 have internal module wiring 398 connected to the common output module pads 340. The common output module pads 340 are connected 341 in a predetermined fashion to the common output pads 338 on the integrated circuit die 300. Conventionally, output module pads 340 are connected to the output pads 338 as wirebonds, tape automated bonds, and solder bumps of ball grid array. The common input signals 386 and the common output signals 388 are typically, but not exclusively, timing control, and test stimulus signals.

The selectable input function signals 312 are introduced through the selectable input function module connectors 320. The selectable input function module connectors 320 are attached to the internal module wiring 392, which is connected to the selectable input module pads 316. The selectable input module pads 316 that will have desired selectable input function signals 312 will be connected 318 to the selectable input/output pads 314 on the integrated circuit die 300. The undesired selectable input function signals will be omitted from the connections 318 between the selectable input module pads 316 and the selectable input pads 314. As described above, the connections 318 may be wire bonds, tape automated bonds, or solder bumps of a ball grid array.

Similarly, the selectable output function signals 394 are transferred to external circuitry connected to the integrated circuit module on a second level of packaging through the selectable output function connectors 328. The selectable output function connectors 328 are attached to the integrated circuit module wiring 396 to the selectable output function module pads 324. The desired selectable output function signals 394 are transferred from the desired output function 308 to the output pads 322 on the integrated circuit die 300. The desired output pads 322 are connected to the corresponding selectable output function module pads 324 and thus to the selectable output function module connectors 328. The undesired output function signals 394 on the output pads 322 are omitted from connection to the selectable output function module pads 324.

The input function select signal 378, the common function select signals 380, and the output function select signals 382 are transferred from external circuitry respectively through the input option select module connectors 348, the common option select module connectors 356, and the output option select module connectors 364. The input option select module connectors 348, the common option select module connectors 356 and output option select module connectors 364 are respectively connected through module interconnecting wire to the input option select module pads 354, the common option select module pads 344, and the output option select module pads 362.

Generally, the input function select signals 378, the common function select signals 380, and the output function select signals 382 are logic states established by either the power supply voltage source Vdd for a logic state of 1 or a ground reference voltage GND for a logic state of 0. To establish one logic state, the input/output pads 342, 350, 358 of the integrated circuit die 300 are connected appropriately 346, 352, 360 to the input option select module pads 354, the common option select module pads 344, and the output option select module pads 362. Conversely, to establish the second logic state, the input/output pads 342, 350, 358 of the integrated circuit die 300 are appropriately omitted from the connections 346, 352, 360 to the input option select module pads 354, the common option select module pads 344 and the output option select module pads 362.

One technique for implementing the selection of the multiple selectable functions of the integrated circuit die 300 is to place the input/output pads 314, 322, 330, 338, 342, 350, 358 as an array of connecting pads on the surface of the known good integrated circuit die 300. A solder bump is applied to each of the input/output pads 314, 322, 330, 338, 342, 350, 358 in a structure of a ball grid array. By connecting or omitting connections to desired input/output pads 314, 322, 330, 338, 342, 350, 358 of the integrated circuit die 300, the desired functions of the multiple selectable input functions are "gang-bonded" to the module pads 316, 324, 334, 340, 344, 354, 362. Since the formation of the input/output pads 314, 322, 330, 338, 342, 350, 358 is inherent in the processing of the wafer containing the multiple selectable function integrated circuit die 300, there is no additional cost in forming the multiple selectable function integrated circuit die 300. However, since only one design of the multiple selectable function integrated circuit die 300 is maintained, inventory is simplified and costs reduced.

Figure 1:
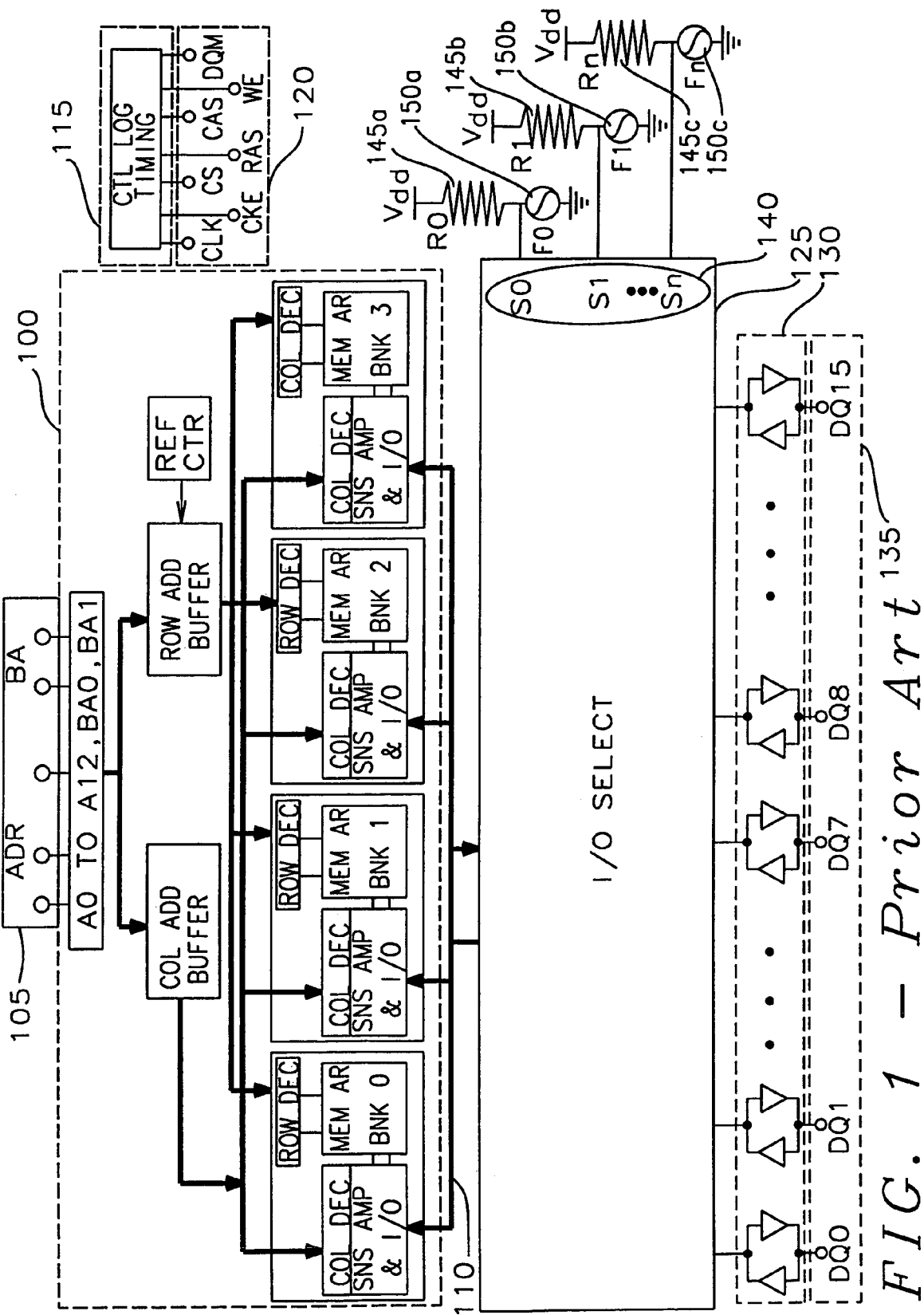
FIG. 1 is a schematic diagram of a DRAM illustrating the configuring circuitry of the prior art.
Figure 2:
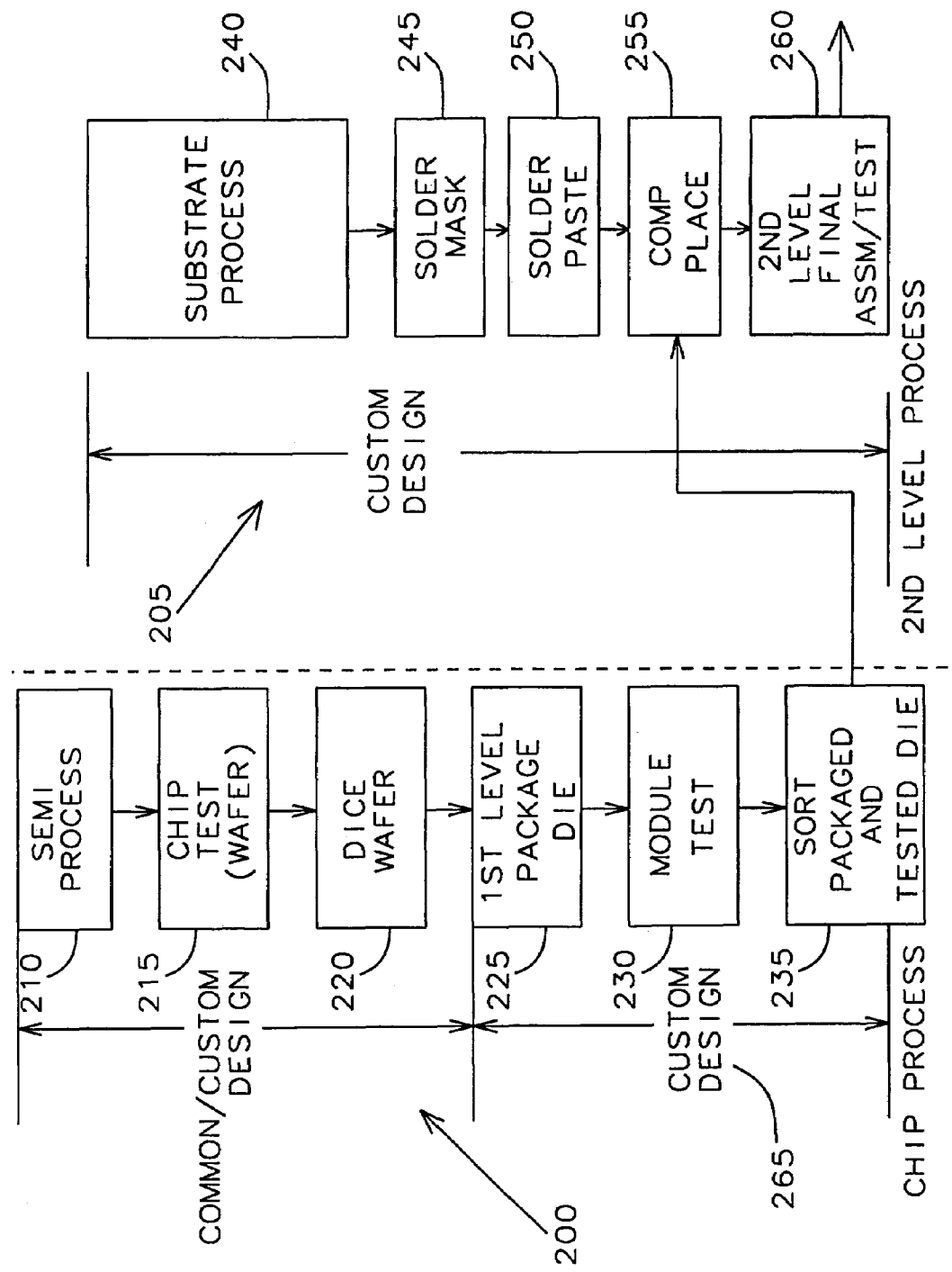
FIG. 2 is a flow chart illustrating the method of assembly of an integrated circuit chip on a second level assembly of the prior art.

Refer now to FIG. 4 for an implementation of an embodiment of this invention as a DRAM having multiple input/output data width configurations. The structure and function of the DRAM array 100 is as described in FIG. 1. The internal data bus 110 is connected to the input/output pad selector 425. The data bus width of the internal data bus 110 is at least the width of the widest data bit width configuration of input/output data bus 455. The input functions 306 and the output function 308 of FIG. 3 are combined in this embodiment as the data input/output functions 430, 440, and 450.

Data is received from or transferred to the DRAM module through the data connections 435, 445, and 455. The data connections 435, 445, and 455 are attached to each of the data input/output functions 430, 440, and 450. It should be noted that while each data input/output function 430, 440, and 450 have effective different functions, each data input/output function 430, 440, and 450 may share one or more of the data connections 435, 445, and 455. In this case, the data input/output functions 430, 440, and 450 establish the data bit width configurations and data connections, such as DQ0, are shared by all the data input/output functions.

Each data connection DQ0, DQ1, . . . , DQn is connected to the input of a receiver 480 and the output of a driver 470. The output of the receiver 480 is the input of the demultiplexer 475. Each output of the demultiplexer 475 is connected to the input/output selector 425 and through the input/output selector 425 to the internal data bus 110. The demultiplexer 475 collects singularly, a number of data bits equivalent to the number of bits for the internal data bus 110, and transfers them through the input/output selector 425.

The internal data bus 110 is connected to the inputs of the multiplexer 465. The output of the multiplexer 465 is the input of the driver 470. The output of the driver 470 is connected to one of the data connections DQ0, DQ1, . . . , DQn. The multiplexer 465 collects a number of data bits from internal data bus 110 through the input/output selector 425 and serialize these data bits for transfer to the one data connection.

Each of the data input/output functions 430, 440, and 450 is comprised of at least one set of the receivers 480, drivers 470, multiplexers 465, and demultiplexers 475 connected to one of the data connections DQ0, DQ1, . . . , DQn. This allows the configurations of the input/output data buses 435, 445, and 455 to be varied as desired. Thus, a single DRAM array design can be configured with any desired bit data width.

The input/output selector 425 selects which of the input/output functions 430, 440, and 450 that are to be configured within a package. The select inputs 460 of the input/output selector 425 provide the appropriate logic states to select the desired input/output configuration or which of the input/output functions 430, 440, and 450 are to be implemented. The select inputs 460 are connected to the option decoder 420. The option decoder 420 is connected to the option receivers 425 which, in turn, are connected to the option select connections 410.

The DRAM integrated circuit die is processed and tested as described above and the known good die are inventoried. Mounting the known good DRAM die on a second level package such as a "chip-on-chip" structure, a ceramic module, a plastic package, a fiberglass reinforced plastic printed circuit card, or an insulator coated metal selects the desired optional configuration for the DRAM module.

Refer to FIGS. 5*a-e* to discuss an implementation of a DRAM module of this invention as explained in FIG. 4. The known good DRAM die of FIG. 4 has its input/output connections implemented as an array 505 of solder bumps on the surface 500 of the known good DRAM die. The selectable data input/output connections 510 and the option select connections 515 are placed conveniently on the surface of the known good DRAM die. In this instance, it is an area of three columns and six rows.

This implementation as shown is for a DRAM having optional organization ×1 (by one), ×4 (by four), ×8 (by eight), and ×16 (by 16). That is there are four input/output functions requiring two option select connections Op1 and OP2. The ×1 option activates only the input/output function connected to the selectable data input/output connection DQ0. The ×4 option activates the input/output functions connected to the selectable data input/output connections DQ0, DQ1, DQ2, and DQ3. The ×8 option activates the input/output functions connected to the selectable data input/output connections DQ0, DQ1, . . . , and DQ8. And finally, the ×16 option activates the input/output functions connected to the selectable data input/output connections DQ0, DQ1, . . . , and DQ15.

Figure 5A:
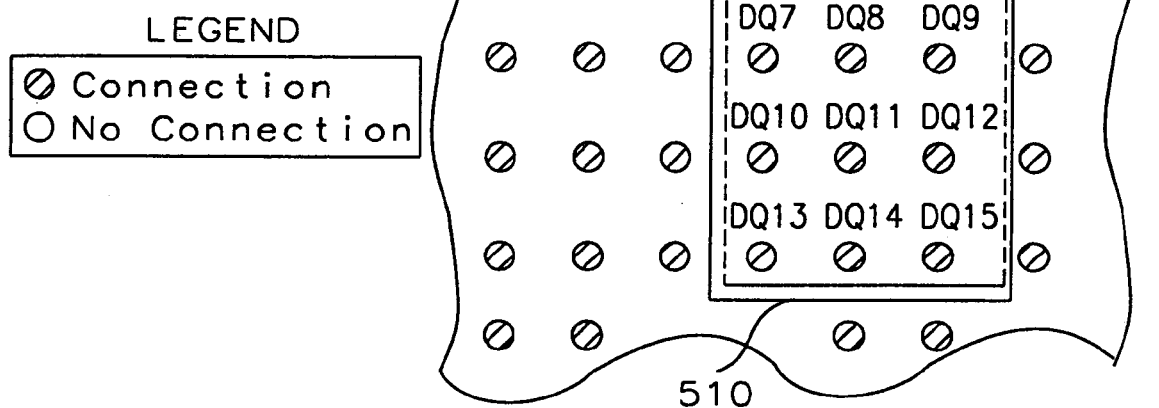
FIGS. 5a-5e are diagrams of an area array of input/output pads of a DRAM module illustrating the configurations of the data input/output pins of this invention.
Figure 5B:
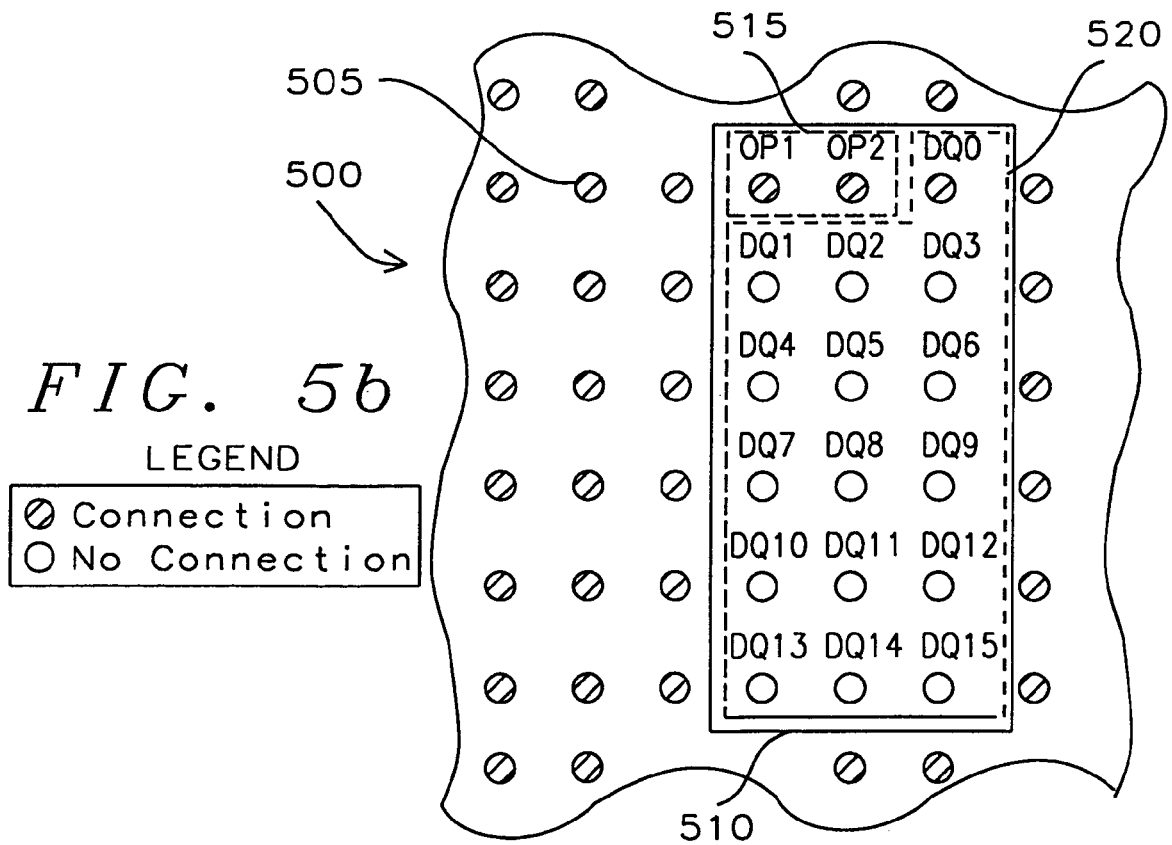

Refer now to FIGS. 5*b*-5*e* for an example of the implementation of the DRAM of this invention. FIG. 5*b* illustrates the implementation of the ×1 organization. In this option, the option select connections 515 are made between the known good DRAM die and the second level package to connect to the necessary logic states to activate the ×1 option. The DQ0 input/output connection of the selectable data input/output connections 520 is made to the second level package for transfer of digital signals. The remaining selectable data input/output connections DQ1, DQ2, . . . , DQ15 520 are masked and the solder balls are not allowed to connect to the interconnecting wiring of the second level substrate.

Figure 5C:
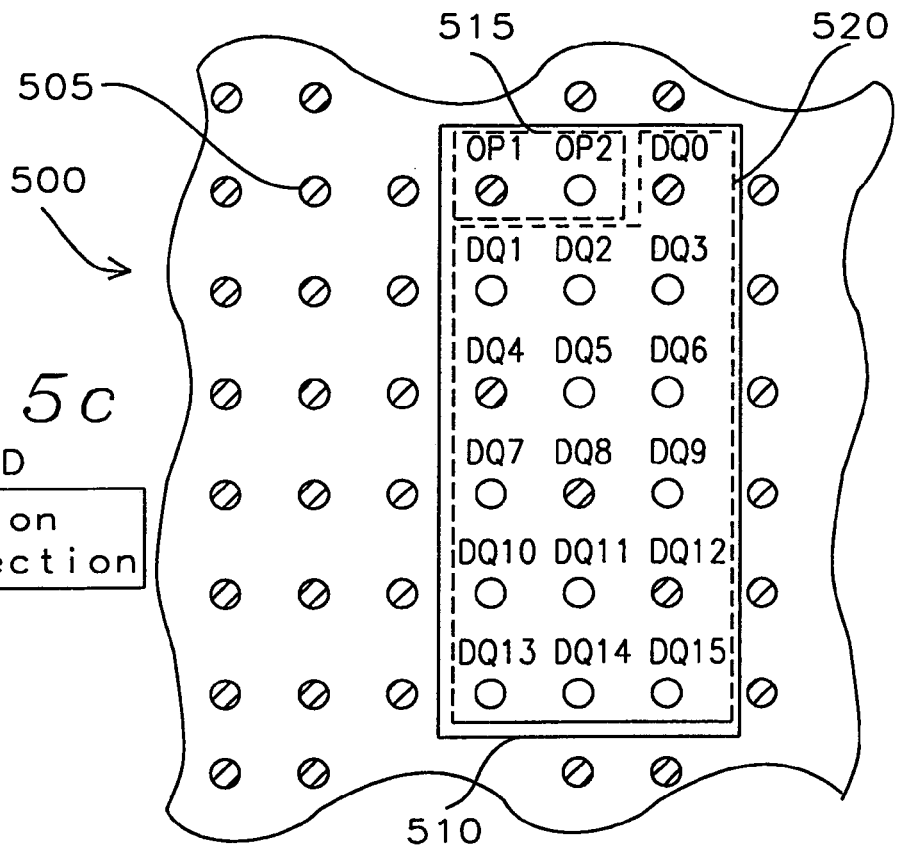

FIG. 5c is a ×4 organization. In this option, the input/output function is selected by the option select connection OP1 being connected to the second level package to place the appropriate logic states at the option desired. The option select connection OP2 is omitted from being made. The selectable data input/output connections DQ0, DQ4, DQ8, and DQ12 of the input/output connections 520 are connected to the second level package. The remaining selectable data input/output connections DQ1, DQ2, DQ3, DQ5, DQ6, DQ7, DQ9, DQ10, DQ11, DQ13, DQ14, and DQ15 are masked and those connections are omitted.

Figure 5D:
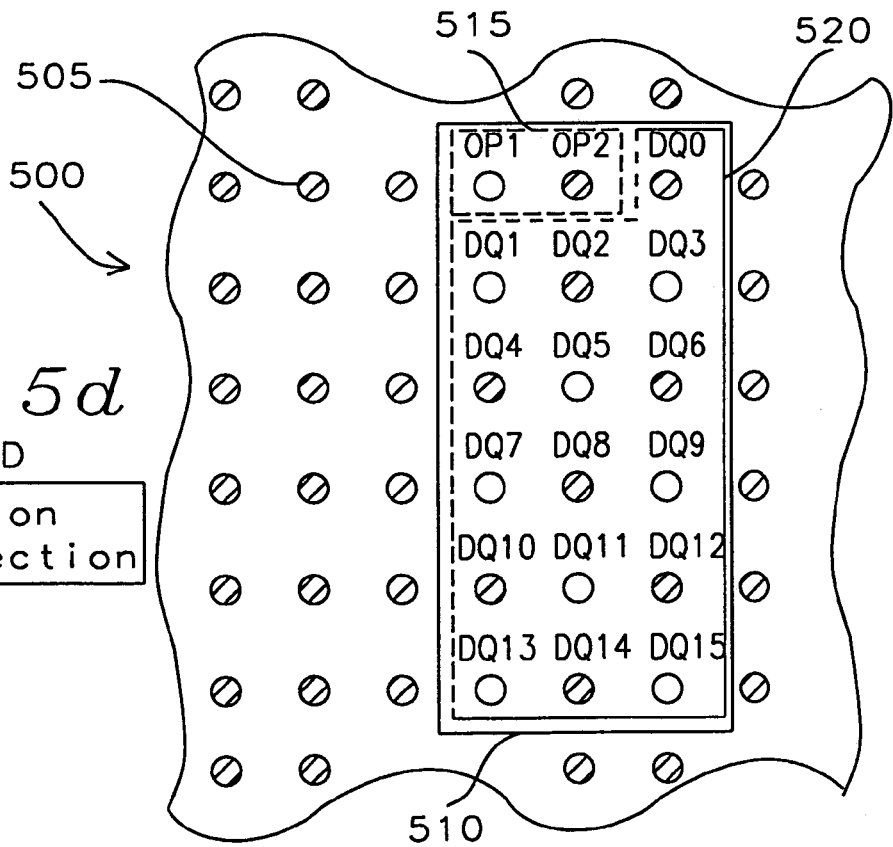

FIG. 5d is a ×8 organization. In this option, the input/output function is selected by connecting the option select connection OP2 and omitting the connection of the option select connection Op1 from the second level package to place the appropriate logic state at the option decoder. The selectable data input/output connections DQ0, DQ2, DQ4, DQ6, DQ8, DQ10, DQ12, and DQ14 are affixed to the second level package and the selectable data input/output connections DQ1, DQ3, DQ5, DQ7, DQ9, DQ11, DQ13 and DQ15 are omitted from the second level package.

Figure 5E:
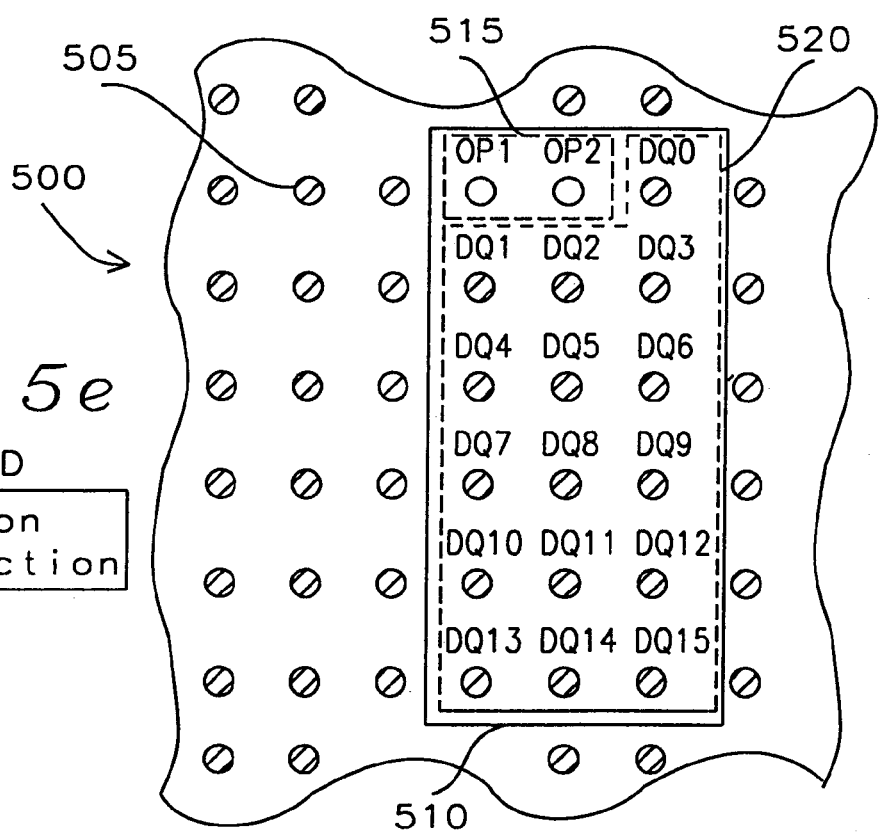

The ×16 option of the known good DRAM die is shown in FIG. 5e. The ×16 option is selected by omitting the option select connections Op1 and OP2 from the second level package to place the appropriate logic state at the option decoder. All of the selectable data input/output connections 520 are joined to the second level package.

The wiring connections of the second level package onto which the known good DRAM die is mounted can have those wiring tracks to implement all options. The masking stage of the module assembly and the placement of the solder paste determine the option implementation of the DRAM module. Alternately, the interconnection pads that will accept the selectable data input/output connections 520 may be omitted and any unnecessary wiring tracks on the second level package may be omitted. This allows routing of wiring tracks of the external circuitry on the second level module to change common computational die to selectable function computational die.

Figure 6:
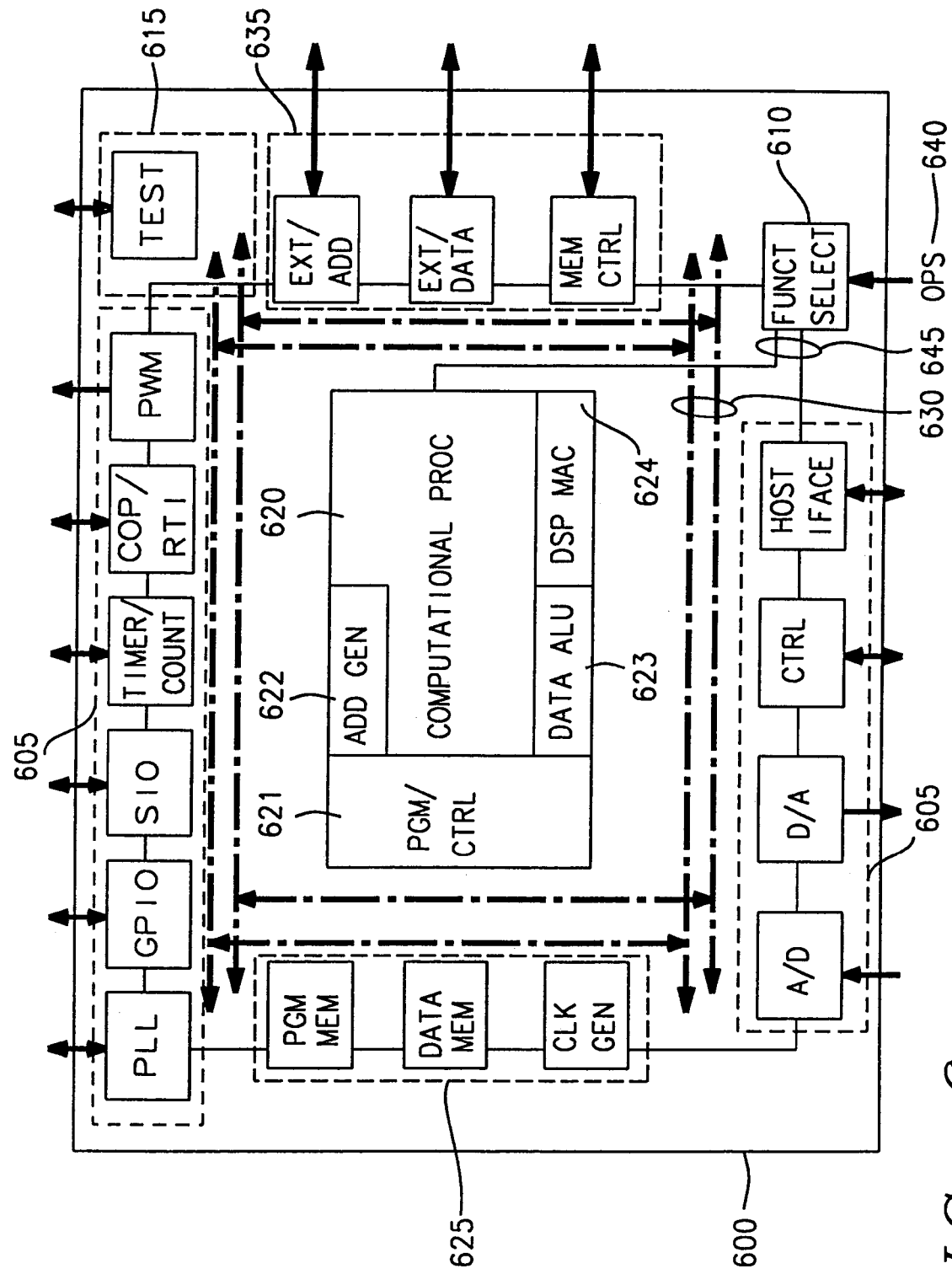
FIG. 6 is a schematic diagram of a multiple selectable function computational processor illustrating the configuration structure of this invention.

A second implementation of the embodiment of this invention is shown in FIG. 6. A digital computational processor module has selectable functions to a common computational die 600 to be configured during mounting to a second level package according to desired optional functions. The optional function configures the common computational die as a general-purpose microprocessor, a special function microprocessor, a microcontroller, or a digital signal processor. The common computational die 600 has selectable input functions and selectable output functions 605 that include analog-to-digital converters, digital-to-analog converters, general purpose word-width input/output buses, standard compliant serial interfaces, interfaces to host processors of a system, control signal inputs and outputs, timer/counter inputs and outputs, computer operating properly signals, and interrupt signals. The selectable function computational die has common input functions and common output functions 615 such as a test interface to provide test stimuli and response for the digital computational module. Other selectable input and output functions 635 will be the address, data, and control functions to interface to external memory array.

The internal structure of the selectable function computational die 600 includes certain functions of the computational processor 620. Common functions are functions like program and control decoder logic 621 and address generation logic 622. The selectable functions are the data arithmetic/logic unit 623 and the digital signal processing multiply accumulate unit 624. Other internal selectable functions 625 are the internal program and data memory and the internal timing circuits. The selectable input and output functions 605, 635, the common input and output functions 615, the internal selectable functions 625, and the computational processor 620 are interconnected with the data and control bus 630.

The option select signals 640 provide the appropriate logic states to function select circuit 610 to determine the desired functions of selectable function computational die 600. The function select circuit is connected to the selectable input and output functions 605 and 635, the internal selectable functions 625, and the selectable functions of the computational processor 620 through the selector bus 645.

As described above, all the possible connections of the selectable function computational die 600 are connected to input/output pads thus insuring a single common functional die is inventoried. The second level package provides the logic states for the option select signals 640 and will make the connections to the desired functions of the selectable function computational die 600. The undesired functions on the selectable function computational die 600 are omitted in the mounting of the selectable function computational die from the second level package.

Figure 7:
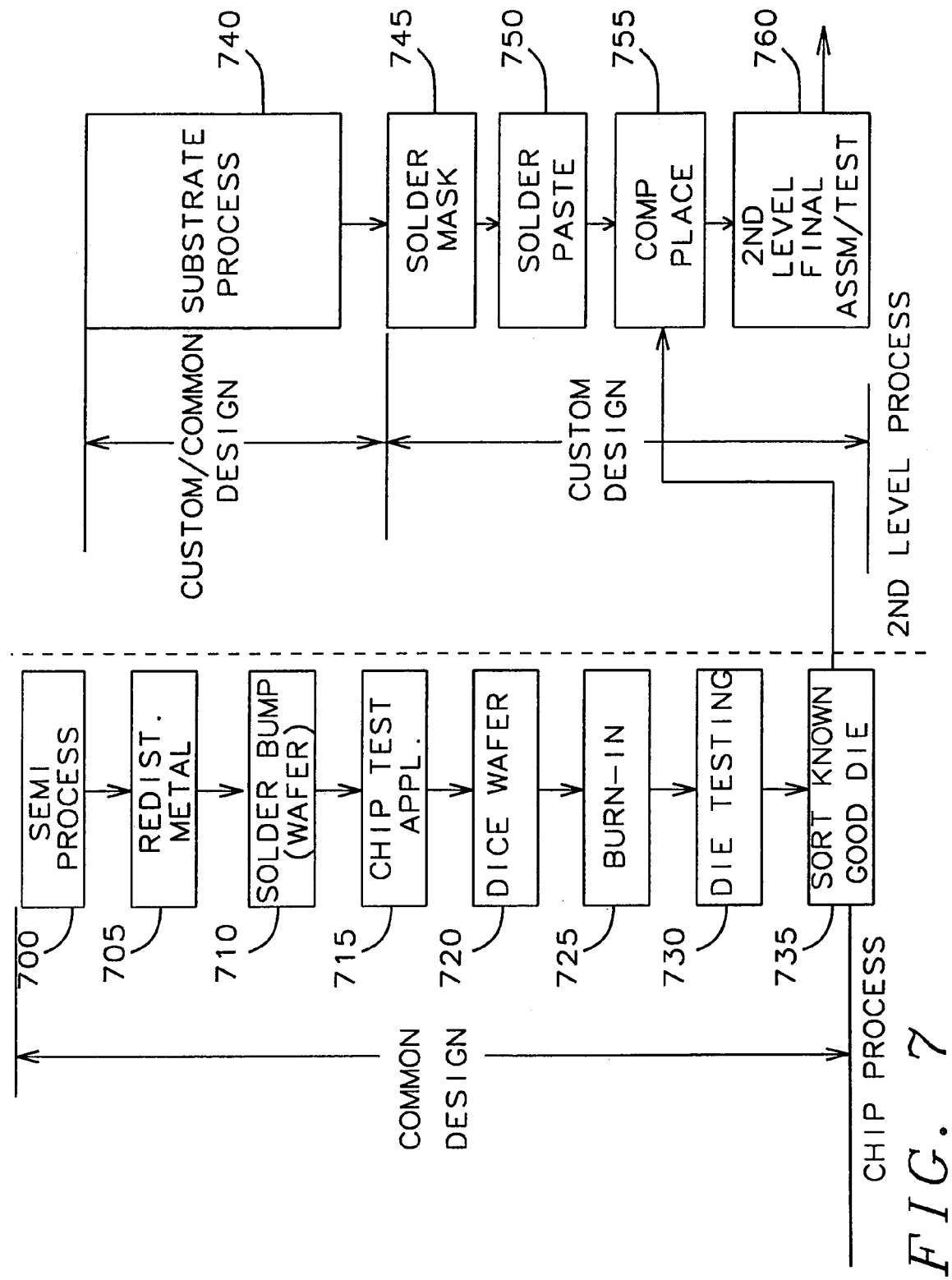
FIG. 7 is a diagram of a flow chart illustrating the method of assembly of a known good integrated circuit die on a second level assembly of the first embodiment of this invention.

For discussion of a method for assembling and selecting desired options of a multiple, selectable function integrated circuit module of the first embodiment, refer to FIG. 7. A multiple selectable function integrated circuit die is formed 700 on a semiconductor wafer by formation and interconnection of electronic circuits on the semiconductor wafer employing known semiconductor processes. Redistribution metal is fabricated 705 on the surface of the semiconductor wafer forming the connections of the common internal functions and the selectable internal functions of the multiple selectable function integrated circuit die to input/output pads on the surface of the semiconductor wafer. The solder bumps are then formed and reflowed to form 710 the solder ball on the surface of the semiconductor wafer. The individual multiple selectable function integrated circuit dies are then tested 715 and the functional multiple selectable function integrated circuit dies are identified. The semiconductor wafer is then diced 720 and the functional multiple selectable integrated circuit die are burned-in 725 to eliminate any early life failures of the functional multiple selectable function integrated circuit dies. The functional multiple selectable function integrated circuit dies are then tested 730 and the known good multiple selectable function integrated circuit die are sorted 735, with the non-functioning die discarded. The forming 700 of the known good multiple selectable function integrated circuit dies allows a single common design to be inventoried.

The second level package module substrate is formed 740 by applying and forming metal interconnection on substrate laminates of the second level package substrate. The laminates are bonded together to create the second level package substrate. The wiring connections on the second level package substrate may either be custom for each option selection of the multiple selectable function integrated circuit or have a common design to minimize inventory of the different option designs.

A solder mask is placed 745 on the second level package substrate. The solder mask will expose the desired interconnecting pads of the metal interconnections on the second level package substrate to implement the desired functional options of the multiple selectable function integrated circuit die. Those undesired functions have no voids in the solder mask to prevent exposure of the metal connections to prevent connection to the input/output pads of the undesired functions of the multiple selectable function integrated circuit dies. Solder paste is applied 750 to make contact with the desired interconnecting pads of the metal interconnections on the second level package substrate. The known good multiple selectable function integrated circuit die are then secured 755 to the second level package substrate to form the connections between the desired functions of the multiple selectable function integrated circuit die and external circuitry through the metal interconnections on the second level package substrate.

The second level package substrate is processed 755 through final assembly and test and is ready for further system level construction. Since the final assembly is the "gang-bonding" as in what is known in the art as "flip chip assembly", no extra cost is incurred to have the ability to select multiple functions during system and subsystem assembly.

It should be noted that the second level package substrate may be a ceramic substrate, a plastic substrate, a fiberglass reinforced substrate, a metal substrate having layers of insulative material to isolate the metal interconnections, semiconductor substrates, a glass substrate, or an integrated circuit die to form a chip-on-chip structure.

Figure 8:
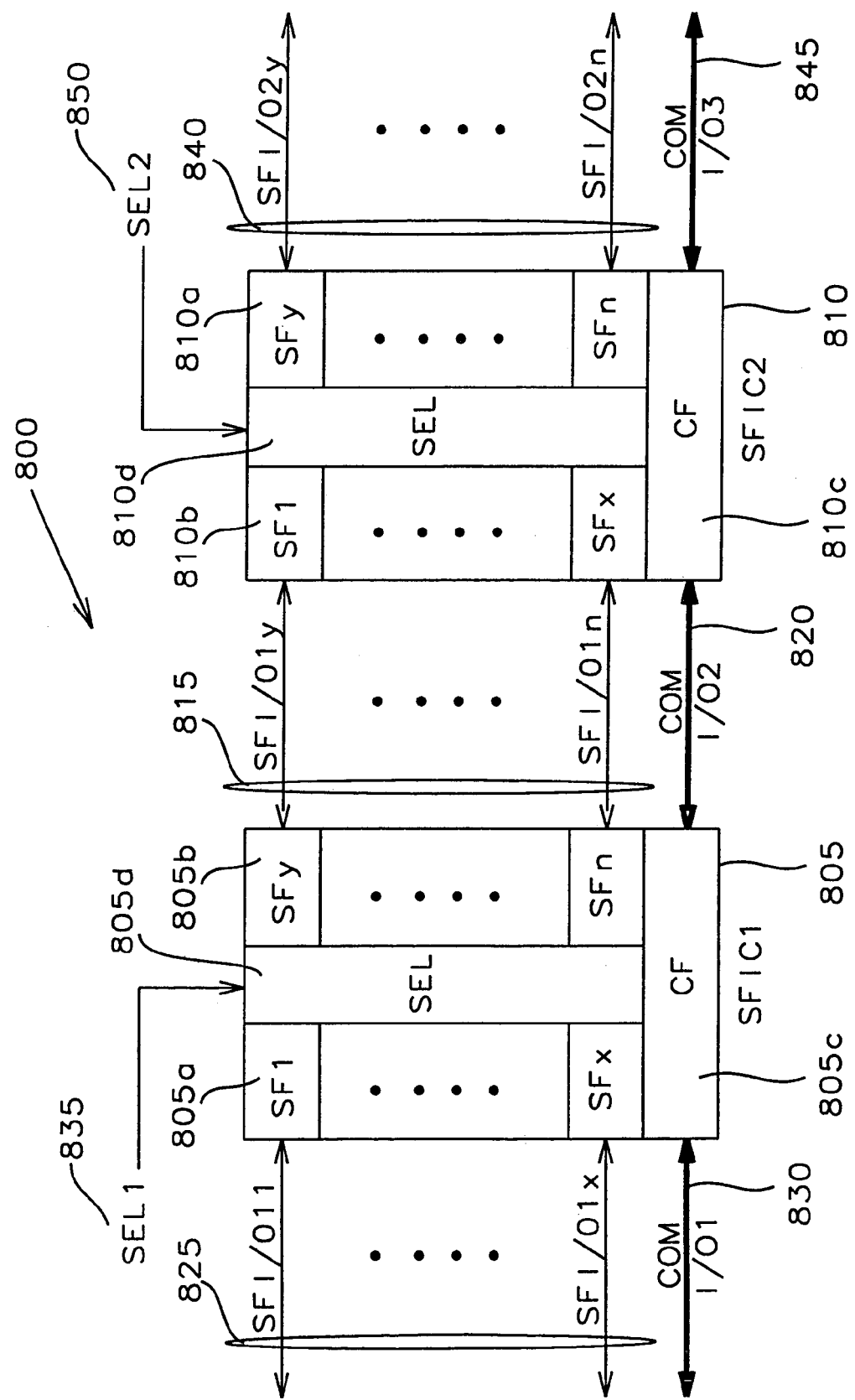
FIG. 8 is a diagram of an integrated circuit package illustrating the configurability of multiple a known good integrated circuit die having multiple selectable functions of this invention.

FIG. 8 illustrates a packaging structure 800 where more than one multiple selectable function integrated circuit die 805 and 810 are connected together to form a more complex subsystem having selectable interconnecting functions. The multiple selectable function integrated circuit die 805 and 810 are structured as described in FIG. 3. The selectable functions of the first multiple selectable function integrated circuit die 805 differ from those of the second multiple selectable function integrated circuit die 810.

The selectable input functions and selectable output functions of FIG. 3 are represented jointly as the selectable input/output functions 805*a*, 805*b*, 810*a*, and 810*b*. Certain selectable input/output functions 805*a* and 810*a* are connected through the selectable input/output function connectors 825 and 840 to circuitry external to the illustrated packaging structure 800. Other selectable input/output functions 805*b* and 810*b* are appropriately interconnected through the selectable input/output connectors 815.

The common functions 805*c* and 810*c* are connected to the circuitry external to the illustrated packaging structure 800 through the common function connectors 830 and 845. The common functions 805*c* of the first multiple selectable function integrated circuit die 805 are interconnected through the common function connectors 820 to the common functions 810*c* of the second multiple selectable function integrated circuit die 810.

The option select signals 835 and 850 are each an aggregate of the option select signals of FIG. 3. The option select signals 835 are connected to the option selector 805*d* of the first multiple selectable function integrated circuit die 805, and the option select signals 850 are connected to the option selector 810*d* of the second multiple selectable function integrated circuit die 810.

As described for an individual multiple selectable function integrated circuit die of FIG. 3, the selectable input/output functions 805*a*, 805*b*, 810*a*, and 810*b* are chosen by application of the appropriate logic state to the option selectors 805*d* and 810*d*. This is accomplished by selectively connecting or omitting connections of the option select signals 835 and 850 respectively to the options selectors 805*d* and 810*d*. Further, those desired selectable input/output connectors 815, 825, and 840 are established during the attaching of the first and second multiple selectable function integrated circuit die 805 and 810 to a second level package assembly. The undesired selectable input/output connectors 815, 825, and 840 are omitted during the attaching as described above.

The first and second multiple selectable function integrated circuit die 805 and 810 may each be a DRAM, a computational processor (microprocessor, a microcontroller, a digital signal processor, etc.), or other logic or analog functional integrated circuit die. Additionally, the first multiple selectable function integrated circuit die 805 may be attached to the second multiple selectable function integrated circuit die 810. Conversely, the second multiple selectable function integrated circuit die 810 may be attached to the first multiple selectable function integrated circuit die 805. Further, the first multiple selectable function integrated circuit die 805 and the second multiple selectable function integrated circuit die 810 may mounted one to another in a "chip-on-chip" structure. An example of the above would be the mounting of a DRAM known good integrated circuit die as the first multiple selectable function integrated circuit die 805 to a complex logic function as the second multiple selectable function integrated circuit die 810.

In the construction of electronic assemblies, the minimum spacing allowed for the second level or system level packaging is often larger than the maximum spacing desired for the input/output pads of an integrated circuit. To compensate for the inequities in the geometries of the integrated circuit and the second level packaging, a module or first level packaging is interposed between the integrated circuit and the second level packaging. The first level packaging acts as an interconnection adapter to connect the input/output pads of the integrated circuit with the pin or interconnection pads of the second level package. The integrated circuit chip is mounted to the first level package with connections to the wiring of the first level packaging. The wiring of the first level packaging provides a direct one-to-one connection for each input/output pad of the integrated circuit to the interconnection pads of the second level package with no circuit characterization provided in the first level package. The first level package is thus provides a spatial transform between the integrated circuit chip and the second level package.

Figure 9:
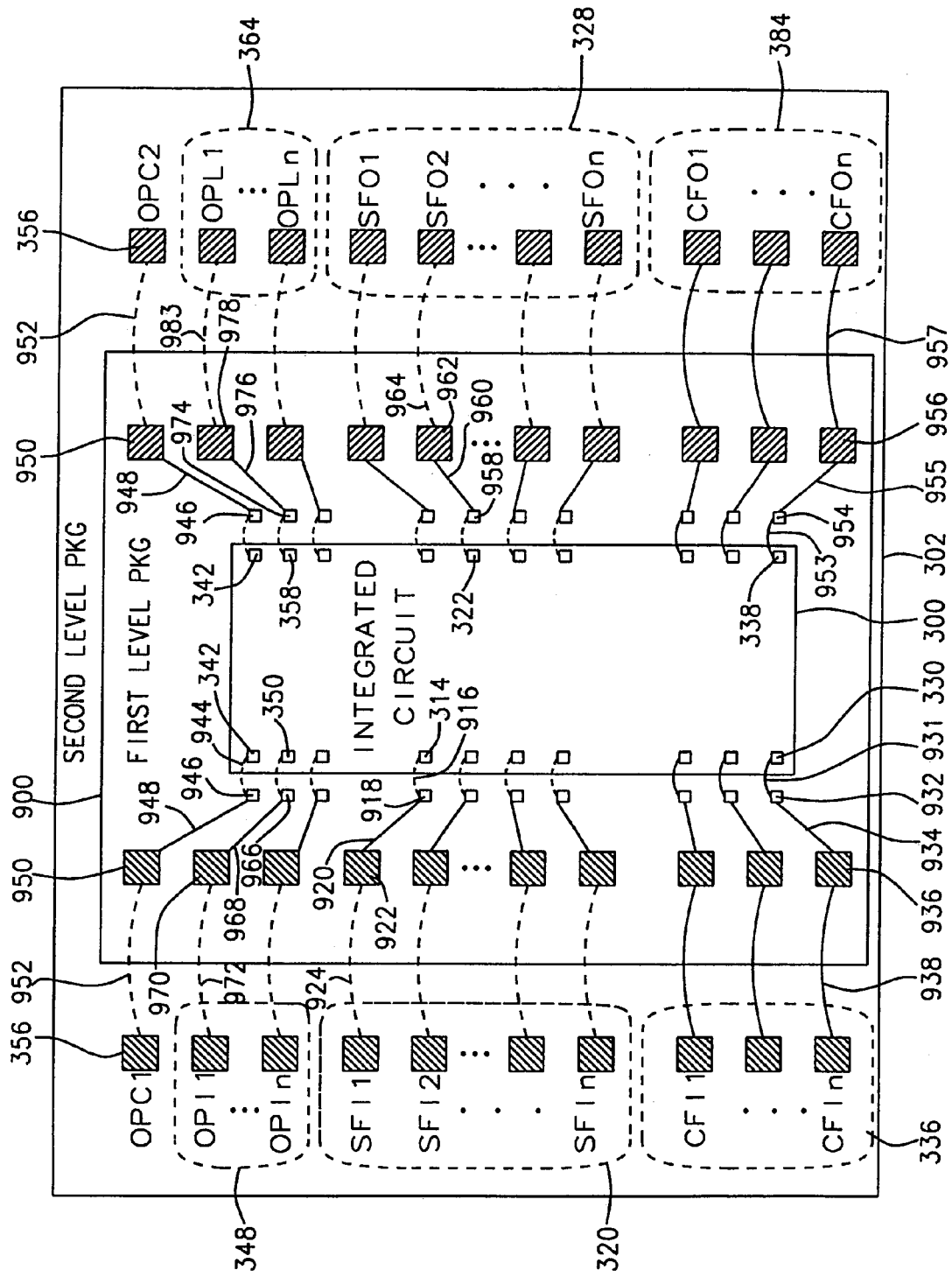
FIG. 9 is a diagram of an integrated circuit package illustrating the configurability of a known good integrated circuit die having multiple selectable functions of the second embodiment of this invention.

Refer now to FIG. 9 for a discussion of a second embodiment of the present invention. The integrated circuit 300 is designed and fabricated as described in FIG. 3. However instead of being place directly on a module that is effectively the second level or system package, the integrated circuit 300 is mounted and secured to the first level or module package 900. The input/output pads 314, 322, 330, 338, 342, 350, and 358 are respectively connected to the interconnection pads 918, 958, 932, 954, 946, 966, and 974 of the first level package 900 respectively by the connections 916, 960, 931, 953, 948, 968, and 976. The connections 916, 960, 931, 953, 948, 968, and 976 are permanently established when the integrated circuit 300 is mounted and secured to the first level package 900. Thus, the first level package 900, in effect, becomes a space transform to transform the maximum spacings allowed of the integrated circuit 300 to the minimum spacings allowed by the second level package 302.

The interconnection pads 918, 958, 932, 954, 946, 966, and 974 of the first level package 900 have dimensions and spacings to facilitate connection with the input output pads 314, 322, 330, 338, 342, 350, and 358 of the integrated circuit chip 300. To adapt to the minimum spacings allowable by the second level package 302, the first level package 900 must have interconnection pads or pins 922, 962, 936, 956, 950, 970, and 978 that attach to the second level package 302. The interconnection pads 922, 962, 936, 956, 950, 970, and 978 are respectively connected to the interconnection pads 918, 958, 932, 954, 946, 966, and 974 by the wiring connections 920, 960, 934, 955, 948, 968, and 976 of the first level package 900.

The common input and the common output signals 386 and 388 that are common to all configurations of the integrated circuit module are introduced to the common input module connectors 336 and are received from the common output module connectors 338. The common input module connectors 336 are connected to the common input pads 330 in a predetermined fashion by way of the connection 938 to the interconnection pads 936 of the first level package 900. Likewise, the common output module pads 340 are connected 957 in a predetermined fashion to the common output pads of the common output signals 384 on the second level package by way of the interconnection pads 956 of the first level package 900.

The selectable input function signals 312 are introduced through the selectable input function module connectors 320. The selectable input function module connectors 320 are selectably connected by the connections 924 to the interconnection pads 922 and thus to the input/output pads 314 of the integrated circuit. The undesired selectable input function signals 906 will be omitted from the connections 924 between the interconnection pads 922 of the first level package and selectable input function module connectors 320.

Similarly, the selectable output function signals 394 are transferred to external circuitry connected to the integrated circuit module on a second level of packaging through the selectable output function connectors 328. The selectable output function connectors 328 are attached to the first level package by the connections 964 to the interconnection pads 962 of the first level package. The desired selectable output function signals 394 are transferred from the desired output function 308 to the output pads 322 and thus to the interconnection pads 962. The interconnection pads 962 and thus desired output pads 322 are connected to the selectable output function module connectors 328. The undesired output function signals 394 on the output pads 322 are omitted from connection to the selectable output interconnection pads 962.

The input function select signal 378, the common function select signals 380, and the output function select signals 382 are transferred from external circuitry respectively through the input option select module connectors 348, the common option select module connectors 356, and the output option select module connectors 364. The input option select module connectors 348, the common option select module connectors 356 and output option select module connectors 364 are respectively connected through interconnection pads 950, 970, and 978.

Generally, the input function select signals 378, the common function select signals 380, and the output function select signals 382 are logic states established by either the power supply voltage source Vdd for a logic state of 1 or a ground reference voltage GND for a logic state of 0. To establish the appropriate logic state, the input option select module connectors 348, the common option select module connectors 356, and the output option select module connectors 364 are selectively attached to the interconnection pads 950, 970, and 978 by way of the connections 952, 972 and 980.

Figure 10:
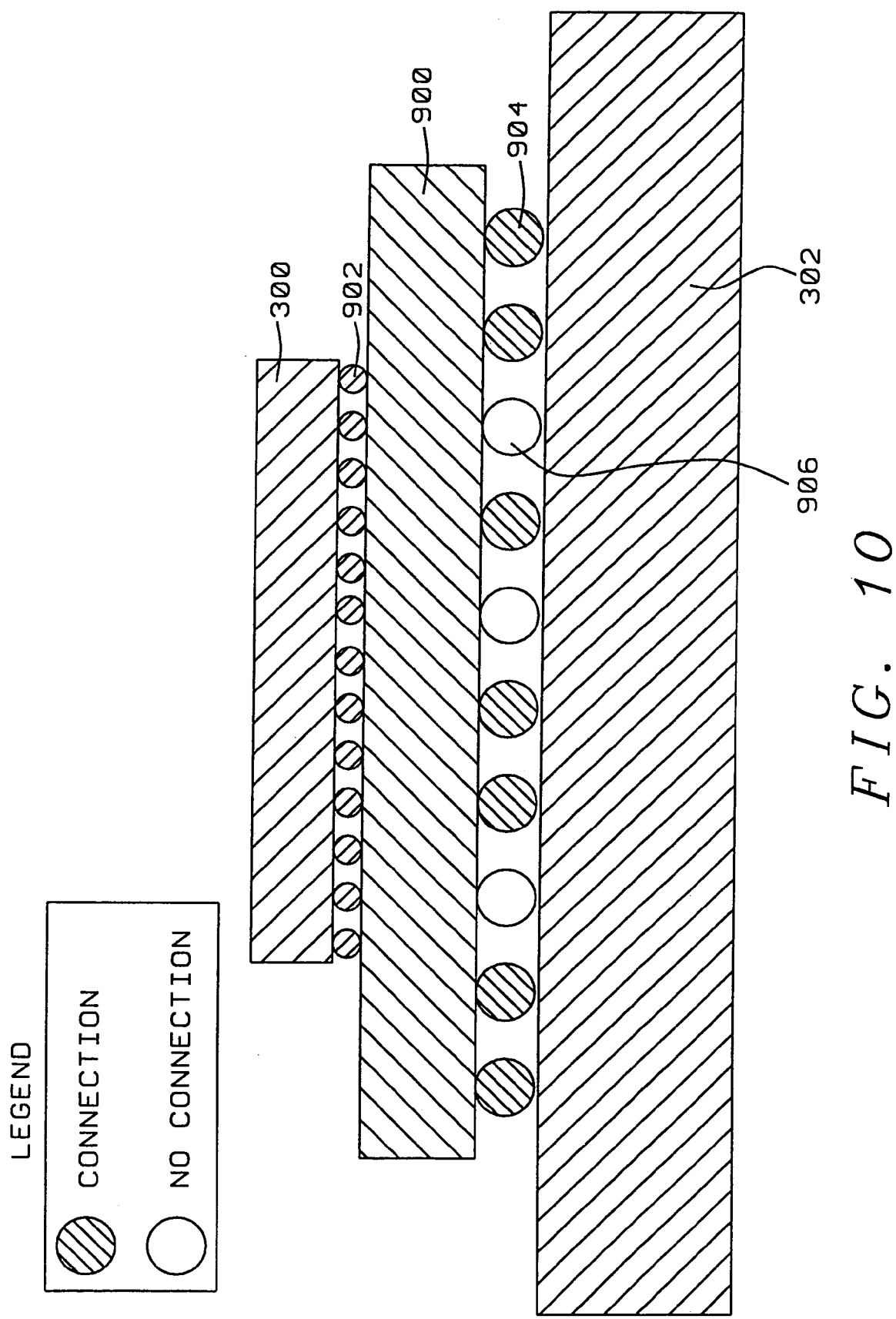
FIG. 10 is a cross sectional view of an integrated circuit package of the second embodiment of this invention.

As described above one technique for implementing the selection of the multiple selectable functions of the integrated circuit die 300 is described in FIG. 10. The integrated circuit die 300 is mounted to the first level package 900 by the solder balls or solder bumps 902. An alternative attachment may be with a Tape Automated Bond or wirebond as described above. All the input/output pads of the integrated circuit die 300 are connected through the solder bumps 902 to the first level package 900. The first level package 900 is mounted to the second level package 302 with the solder balls 904. To configure the function of the integrated circuit die 300, the solder balls 904 are connected or omitted 906 as desired. In this embodiment, the desired functions of the multiple selectable functions are "gang-bonded" to the interconnection pads 922, 962, 936, 956, 950, 970, and 978. Since the formation of the interconnection pads 922, 962, 936, 956, 950, 970, and 978 is inherent in the processing of the first level package 900, there is no additional cost in forming the multiple selectable function integrated circuit die 300 and the first level module 900. However, since only one design of the multiple selectable function integrated circuit die 300 mounted on the first level package 900 is maintained, inventory is simplified and costs reduced.

The solder balls 904 of the implementation are illustrative of the concept of this invention. The connection of the first level package 900 to the second level package 302 may be made by a lead frame having pins that are placed in holes drilled into the second level package 302, as in a dual in-line package (Dual In-Line Package (DIP), Single In-Line Package (SIP), Zig-Zag In-Line Package (ZIP)). Alternately, the pins may be brazed or otherwise affixed to the first level package 900 as in a so-called pin grid array (PGA). The lead frame may also have surface mounted pins that are constructed to be attached to the surface of the second level package 302 as with the leadless and leaded chip carriers (small outline J-leaded chip carriers (SOJ), plastic leadless chip carriers (PLCC), and quad-flat packs (QFP), etc.).

Figure 11:
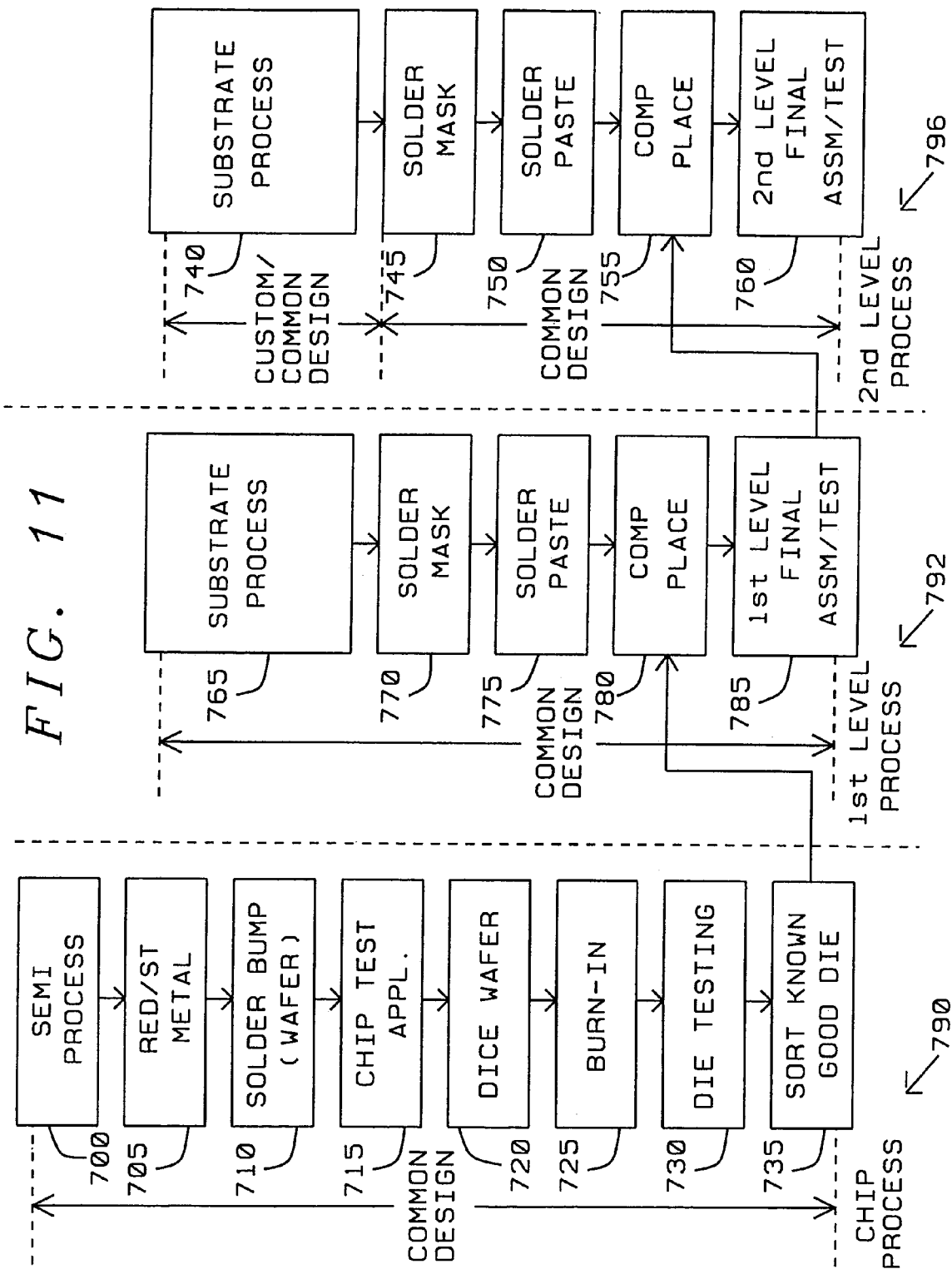
FIG. 11 is a diagram of a flow chart illustrating the method of assembly of a known good integrated circuit die on a second level assembly of the second embodiment of this invention.

Refer now to FIG. 11 for a discussion of the assembling and selecting the desired options of the multiple selectable functions integrated circuit of the second embodiment. The processing 790 of the integrated circuit die 300 of FIG. 9 proceeds as described in FIG. 7 except in this embodiment subsequent to the sorting 790 of the known good die the integrated circuit die 300 is mounted on the first level package 900.

The processing 792 of first level package begins with the first level package module substrate being formed 765 by applying and forming metal interconnection on substrate laminates of the first level package substrate. The laminates are bonded together to create the first level package substrate. The wiring connections on the first level package substrate have a common design to minimize inventory of the different option designs.

A solder mask is placed 770 on the first level package substrate. The solder mask exposes the interconnecting pads of the metal interconnections on the first level package substrate to permit connections of the input/output pads of the multiple selectable function integrated circuit die. Solder paste is applied 775 to make contact with the interconnecting pads of the metal interconnections on the first level package substrate. The known good multiple selectable function integrated circuit die are then secured 780 to the first level package substrate to form the connections between the desired functions of the multiple selectable function integrated circuit die and external circuitry through the metal interconnections on the first level package substrate.

The first level package substrate is processed 785 through final assembly and test and is ready for further system level construction. Since the final assembly is the "gang-bonding"

as in what is known in the art as "flip chip assembly", no extra cost is incurred to have the ability to select multiple functions during system and subsystem assembly.

The second level process 796 is executed as described in FIG. 7 except that instead of the integrated circuit die being mounted to the second level package, the first level package as described above is the component placed 755 on the second level package.

It should be noted that the first and second level package substrates may be a ceramic substrate, a plastic substrate, a fiberglass reinforced substrate, a metal substrate having layers of insulative material to isolate the metal interconnections, semiconductor substrates, a glass substrate, or an integrated circuit die to form a chip-on-chip structure.

While this invention has been particularly shown and described with reference to the preferred embodiments thereof, it will be understood by those skilled in the art that various changes in form and details may be made without departing from the spirit and scope of the invention.

The invention claimed is:

1. A circuit component comprising:
   a substrate;
   a solder mask on said substrate, wherein an opening in said solder mask exposes a pad of said substrate;
   a die over said substrate in a flip-chip assembly, wherein said die comprises a first functional circuit and a second functional circuit;
   a first solder bump between said die and said substrate, wherein said first solder bump connects said first functional circuit to said pad through said opening; and
   a second solder bump between said die and said substrate, wherein said second solder bump is connected to said second functional circuit, and wherein said second solder bump is not connected to any pad of said substrate.

2. The circuit component of claim 1, wherein said die comprises a DRAM.

3. The circuit component of claim 1, wherein said first functional circuit implements a DRAM array address function.

4. The circuit component of claim 1, wherein said first functional circuit implements a SRAM array address function.

5. The circuit component of claim 1, wherein said first functional circuit implements a non-volatile memory array address function.

6. The circuit component of claim 1, wherein said second functional circuit implements a function to select one from multiple types of data width.

7. The circuit component of claim 6, wherein said multiple types of data width comprise by-sixteen data width.

8. The circuit component of claim 6, wherein said multiple types of data width comprise by-eight data width.

9. A circuit component comprising:
   a substrate comprising a metal interconnection;
   a solder mask on said substrate, wherein an opening in said solder mask exposes a pad of said metal interconnection;
   a die over said substrate in a flip-chip assembly, wherein said die comprises a first functional circuit and a second functional circuit;
   a first solder bump between said die and said substrate, wherein said first solder bump connects said first functional circuit to said pad through said opening, and wherein said metal interconnection connects said first functional circuit to an external circuit of said die and said substrate; and
   a second solder bump between said die and said substrate, wherein said second solder bump is connected to said second functional circuit, and wherein said second solder bump is not connected to any external circuit of said die and said substrate.

10. The circuit component of claim 9, wherein said die comprises a DRAM.

11. The circuit component of claim 9, wherein said first functional circuit implements a DRAM array address function.

12. The circuit component of claim 9, wherein said first functional circuit implements a SRAM array address function.

13. The circuit component of claim 9, wherein said first functional circuit implements a non-volatile memory array address function.

14. The circuit component of claim 13, wherein said second functional circuit implements a function to select one from multiple types of data width.

15. The circuit component of claim 14, wherein said multiple types of data width comprise by-sixteen data width.

* * * * *